(12) United States Patent
Whiteley et al.

(10) Patent No.: US 11,233,516 B1
(45) Date of Patent: Jan. 25, 2022

(54) SINGLE FLUX QUANTUM CIRCUIT THAT INCLUDES A SEQUENCING CIRCUIT

(71) Applicant: Synopsys, Inc., Mountain View, CA (US)

(72) Inventors: Stephen Robert Whiteley, Sunnyvale, CA (US); Jamil Kawa, Campbell, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 16/926,379

(22) Filed: Jul. 10, 2020

(51) Int. Cl.
*H03K 19/195* (2006.01)
*G06N 10/00* (2019.01)
*H03K 19/00* (2006.01)
*H03K 17/92* (2006.01)

(52) U.S. Cl.
CPC ........ *H03K 19/1952* (2013.01); *G06N 10/00* (2019.01); *H03K 17/92* (2013.01); *H03K 19/0008* (2013.01); *H03K 2217/0036* (2013.01)

(58) Field of Classification Search
CPC ........... H03K 19/1952; H03K 19/0008; H03K 17/92; H03K 2217/0036; G06N 10/00
USPC .......................................................... 326/4
See application file for complete search history.

(56) References Cited

U.S. PATENT DOCUMENTS

| | | | | |
|---|---|---|---|---|
| 6,118,284 | A  * | 9/2000  | Ghoshal ................. | G01R 33/02 324/754.29 |
| 7,733,253 | B2 * | 6/2010  | Kirichenko ......... | H03M 1/0604 341/133 |
| 9,520,180 | B1 * | 12/2016 | Mukhanov ............... | A61K 8/42 |
| 9,543,959 | B1 * | 1/2017  | Carmean .................. | H03K 3/38 |
| 10,331,163 | B1 * | 6/2019  | Luo .................... | G01R 33/0358 |
| 10,554,207 | B1 * | 2/2020  | Herr .......................... | G11C 8/16 |
| 10,608,044 | B1 * | 3/2020  | Herr ........................ | H01L 27/18 |
| 2003/0016069 | A1 * | 1/2003  | Furuta ..................... | G06N 10/00 327/367 |
| 2004/0022332 | A1 * | 2/2004  | Gupta .................... | H04B 1/001 375/343 |
| 2008/0231353 | A1 * | 9/2008  | Filippov ................. | H01L 25/04 327/551 |
| 2015/0254571 | A1 * | 9/2015  | Miller ..................... | G11C 11/44 326/3 |
| 2016/0125102 | A1 * | 5/2016  | Shauck ................. | G06F 30/398 716/103 |
| 2018/0226975 | A1 * | 8/2018  | Braun ................... | H01L 39/025 |

* cited by examiner

*Primary Examiner* — Don P Le
(74) *Attorney, Agent, or Firm* — Park, Vaughan, Fleming & Dowler LLP; Laxman Sahasrabuddhe

(57) ABSTRACT

A single flux quantum (SFQ) circuit can include a combinational logic network, which can include a set of SFQ logic cells. The SFQ circuit can also include an SFQ sequencing circuit, which can be used to generate delayed versions of clock pulses to clock the set of SFQ logic cells.

19 Claims, 13 Drawing Sheets

US 11,233,516 B1

SINGLE FLUX QUANTUM CIRCUIT THAT INCLUDES A SEQUENCING CIRCUIT

GOVERNMENT LICENSE RIGHTS

This invention was made with United States (U.S.) government support under Contract No. W911NF-17-9-0001 awarded by the U.S. Intelligence Advanced Research Projects Activity (IARPA). The U.S. government has certain rights in the invention.

RELATED APPLICATION

This application is related to U.S. patent application Ser. No. 16/926,388, entitled "Single flux quantum buffer circuit", filed on Jul. 10, 2020, and U.S. patent application Ser. No. 16/926,385, entitled "Single flux quantum inverter circuit", filed on Jul. 10, 2020. The contents of the above-mentioned applications are herein incorporated by reference in their entirety for all purposes.

TECHNICAL FIELD

The present disclosure relates to circuit designs and circuit design methodologies for single flux quantum (SFQ) circuits that use a Josephson junction (JJ) based current source. More specifically, the present disclosure relates to an SFQ circuit that includes a sequencing circuit.

BACKGROUND

Over the past several decades, an almost unlimited appetite for computing and storage has fueled a rapid increase in the size and complexity of integrated circuit (IC) designs. SFQ technology, which relies on the quantum mechanical quantization of magnetic flux, is a technology that can help meet future computing and storage demands.

SFQ technology uses JJs. A JJ can include two superconducting electrodes separated, for example, by a thin insulating tunnel barrier, which can support a current that can flow indefinitely without any voltage applied. Though SFQ technology itself has numerous variations, all make use of flux storage and transmission, which is affected by pulses emitted by JJs.

SUMMARY

Some embodiments described herein feature a circuit or circuit design that includes an SFQ combinational logic network that includes a set of SFQ logic cells, and an SFQ sequencing circuit to generate delayed versions of clock pulses to clock the set of SFQ logic cells. Embodiments described herein can also include a set of SFQ flip-flop cells, and an output of at least one SFQ flip-flop cell in the set of SFQ flip-flop cells can be coupled to an input of at least one SFQ logic cell in the set of SFQ logic cells.

In some embodiments, at least one SFQ logic cell in the set of SFQ logic cells can include at least one JJ biased using a JJ-based current source. In some embodiments, at least one SFQ logic cell in the set of SFQ logic cells can include a JJ, and an output terminal of the SFQ logic cell can be coupled to a terminal of the JJ through a termination resistance and a superconducting inductor.

Each SFQ flip-flop cell in the set of SFQ flip-flop cells can be assigned a level value of zero, and each SFQ logic cell in the set of SFQ logic cells can be assigned a level value that is one greater than a maximum level value of SFQ flip-flop cells or SFQ logic cells that are coupled to inputs of the SFQ logic cell. The SFQ sequencing circuit can include a series of SFQ delay sub-circuits, and each SFQ delay sub-circuit can correspond to a specific level value. In some embodiments, each SFQ delay sub-circuit can include a Josephson transmission line (JTL) and a splitter sub-circuit that includes one or more splitters. In some embodiments, each SFQ delay sub-circuit can include an SFQ flip-flop and a splitter sub-circuit that includes one or more splitters. In some embodiments, at least one SFQ delay sub-circuit can clock SFQ logic cells in multiple SFQ combinational logic networks.

BRIEF DESCRIPTION OF THE FIGURES

The disclosure can be understood based on the detailed description given below and the accompanying figures. The figures are for illustrative purposes, and do not limit the scope of the disclosure. Furthermore, the figures are not necessarily drawn to scale.

DETAILED DESCRIPTION

Figure 1A:
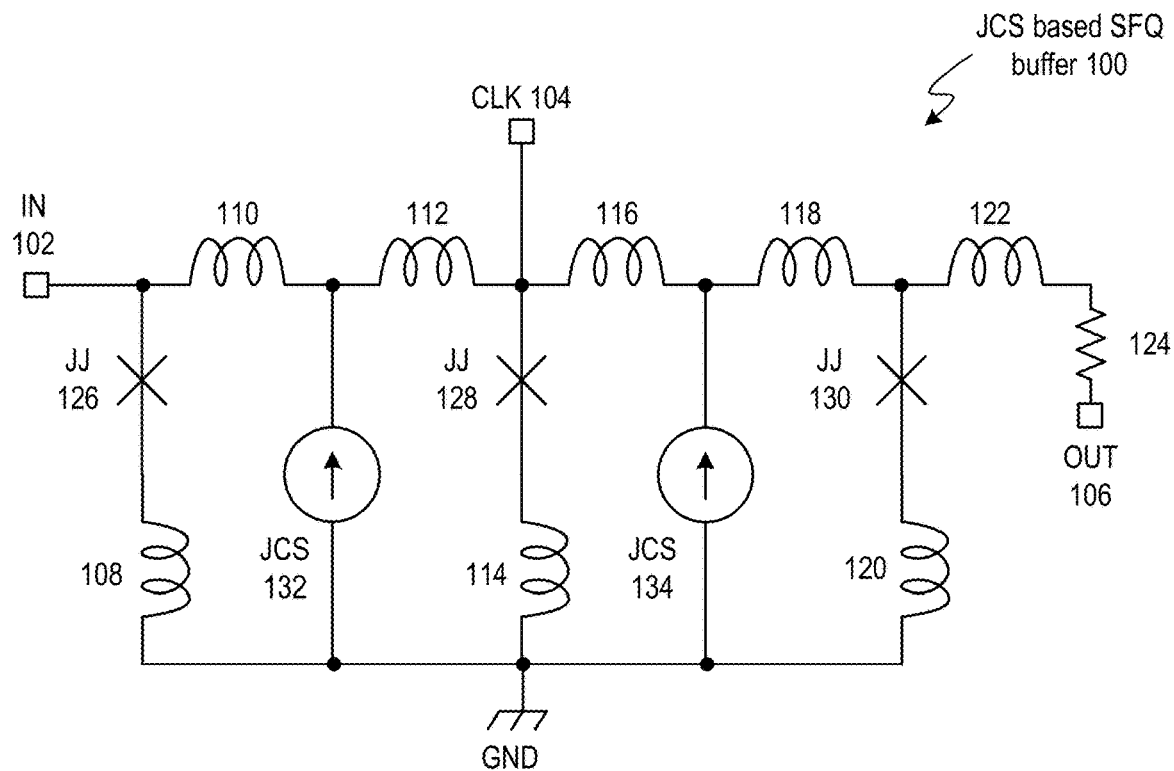
FIG. 1A illustrates a Josephson current source (JCS)-based SFQ buffer circuit in accordance with some embodiments described herein.

When a JJ emits a voltage pulse, it can induce a single quantum of magnetic flux into a superconducting inductor that is electrically connected to the JJ. Some SFQ devices can achieve pulse widths close to a picosecond. In SFQ technology, logic states can be transmitted between logic gates by propagating SFQ pulses, which can be generated by JJs. In some approaches, SFQ pulses can be transmitted between logic gates by using a JTL, which includes a series of superconducting inductors with a JJ connected to ground at the intersections. The inductors can have small inductance values, enabling a long Josephson transmission line with many junctions. Each JJ is biased and therefore consumes current and dissipates power, and each JJ represents a delay in signal propagation. JTLs maintain the essential characteristics of an SFQ pulse with high reliability.

In a very-large-scale integration (VLSI) environment, using JTLs for interconnecting logic gates can cause large delay and delay variation, and the existing automated routing design tools may need to be changed substantially to route JTLs. One alternative to using a JTL is to use a passive transmission line (PTL). A PTL is a stripline structure that has an extremely low power loss due to being superconductive. However, a PTL uses a driver circuit to drive the PTL with a non-SFQ voltage pulse, and a receiver circuit to convert the received pulse back into an SFQ pulse.

One benefit of using PTL interconnections is that designers can use existing routing tools in electronic design automation (EDA) systems to design PTL-based SFQ circuits (as opposed to having to create a whole new family of EDA tools that can handle JTL-based SFQ circuits). However, in such approaches, there are many design trade-offs and technical challenges when PTLs are used with SFQ devices.

As mentioned previously, in certain approaches, a driver circuit and a receiver circuit are used at the transmitting and receiving ends, respectively, of the PTL. A PTL driver circuit includes a JJ that emits SFQ pulses into the transmission line. This can cause multiple problems.

One problem arises from the trade-off between wiring density and transmission line width. To enable the high wiring densities, a designer would like to use narrow transmission lines. However, the narrower the line, the higher the characteristic impedance. The amplitude of the SFQ pulse is limited, so that a higher impedance implies that less pulse energy is injected into the line, thus requiring a higher-sensitivity receiver and/or reducing noise immunity. By way of a non-limiting example that is based on existing technology, an impedance range of a few ohms to perhaps 20 ohms is the approximate range, corresponding to line widths of one to several microns, which is quite large when compared to the typical line widths that are used in today's complementary metal-oxide-semiconductor (CMOS) technology.

Another problem is the generation and propagation of spurious pulses, which can cause subsequent data errors. Specifically, a PTL receiver includes a single JJ biased near its critical current threshold. The pulse from the transmission line has sufficient energy to kick the JJ above its critical current threshold, which can cause the JJ to generate an SFQ pulse, which is the desired output. However, the same pulse is also connected to the transmission line, and can propagate backwards along the transmission line toward the PTL driver. Over time, the stray pulse dies away after reflections from the ends of the transmission lines, however if the timing is such that spurious and subsequent data pulses are coincident, then data errors can result. Such data errors can be avoided by "tuning" the clock frequency and transmission line delays so that such coincidence is avoided, however this can create serious practical problems in a very large scale integration (VLSI) environment, and may reduce the chip flexibility by constraining the clock frequency. Alternatively, the lengths of interconnects can be tuned to avoid certain timing windows based on an assumed clock frequency. However, this can also lead to serious practical difficulties, as the physical layout may need to be changed to modify the transmission line lengths, which can be very difficult for densely wired layouts.

In some SFQ technologies, the bias current of a JJ is determined by the chip supply voltage divided by the dropping resistance associated with the JJ. Thus, there are three independent random variables that control the switching threshold of the JJ: the critical current threshold ($I_c$), bias voltage ($V_{bias}$), and the dropping resistance ($R_{drop}$). The minimum signal amplitude that can be reliably detected is dependent on the statistical variations of these three components. Large variations can occur in these three components due to variations in process and operating conditions, and because of these variations, the sensitivity of the SFQ devices can be low. The low sensitivity of SFQ devices can, in turn, limit the impedance of PTLs to low values and can discourage the use of PTL impedance matching because it can reduce the amplitude. Although lower impedance allows a larger signal amplitude to be injected into the line from a fixed-amplitude source such as a PTL driver, a lower impedance also takes up more area.

Some embodiments described herein can use a first JJ to provide a bias current to a second JJ, where the bias current generated by the first JJ is numerically equal to the critical current of the first JJ. This bias current (which is equal to the critical current of the first JJ) is set to a value slightly smaller than the critical current of the second JJ. In such an SFQ circuit, only local variations in JJ critical currents (i.e., the variation of the critical currents of a set of JJs that are in physical proximity to each other) are expected to affect the switching threshold. In a high-quality process, local variations in JJ critical currents (e.g., critical current variations between adjacent JJs) are substantially smaller compared to the global variations (e.g., variations across the entire IC chip) which limit the sensitivity of existing SFQ technology.

In this disclosure, a JJ-based current source (JCS) refers to a current source that (1) includes a JJ, and (2) is used to bias another JJ. The combination of JCS-based SFQ circuits with PTL-based interconnects allows the use of higher impedance (narrower line width) transmission lines without loss of transmission integrity. Note that higher impedance lines are less sensitive to turns and vias and result in significantly denser routing. The JCS-based SFQ circuits disclosed herein feature a matching back termination resistance at the output of the SFQ circuit, which removes the "resonance" problem (data errors at sharply defined clock frequencies and line lengths) that exists in traditional SFQ technologies. The outputs and the inputs of the JCS-based SFQ cells can be directly connected to PTLs (i.e., without using PTL drivers and receivers). The SFQ circuit designs and SFQ circuit design methodologies presented in this disclosure can leverage existing EDA tools to design dense and energy efficient SFQ-based integrated circuits.

FIG. 1A illustrates a JCS-based SFQ buffer circuit in accordance with some embodiments described herein. JCS-based SFQ buffer circuit 100 includes: input terminal 102, clock terminal 104, and output terminal 106; superconducting inductors 108, 110, 112, 114, 116, 118, 120, and 122; termination resistance 124; JJs 126, 128, and 130; and JCSs 132 and 134.

The current supplied by JCSs 132 and 134 is used to bias JJs 126, 128, and 130. Specifically, the bias currents of the JJs 126, 128, and 130 are set to a level that is less than their critical current $I_c$, and larger than $I_c$ minus the input pulse amplitude that is desired to trigger the JJs (e.g., the minimum input pulse amplitude that is desired to trigger the JJs). Note that, this range of current values (i.e., less than $I_c$, and greater than $I_c$ minus the input pulse amplitude that is desired to trigger the JJs) can be substantially smaller than the critical current $I_c$.

During operation, input pulses can be received at input terminal 102 and clock pulses can be received at clock terminal 104. In SFQ circuits, a sequence of clock pulses can be used to discretize time into a sequence of time periods (or time frames), and a unit of information can be encoded in a given time period based on whether or not a pulse is present in the time period.

JCS-based SFQ buffer circuit 100 has two stable states that correspond to the absence or presence of a clockwise persistent current that circulates in the superconducting loop that includes inductors 108, 110, 112, and 114, and junctions 126 and 128. When a clock pulse is received at clock terminal 104, the state stored in JCS-based SFQ buffer circuit 100 is outputted on output terminal 106, and JCS-based SFQ buffer circuit 100 is reset to a first state, which is also referred to as the "reset" state for the circuit shown in FIG. 1A. The reset state corresponds to the absence of a clockwise persistent current circulating in the superconducting loop that includes inductors 108, 110, 112, and 114, and junctions 126 and 128.

If no input pulse is received at input terminal 102 before the next clock pulse, then JCS-based SFQ buffer circuit 100 remains in the first state (i.e., the reset state). On the other hand, if at least one input pulse is received at input terminal 102, then junction 126 pulses, establishing a clockwise persistent current around the superconducting loop that includes junctions 126 and 128 and storage inductor 112, which causes the JCS-based SFQ buffer circuit 100 to switch to a second state, which is also referred to as the "set" state for the circuit shown in FIG. 1A. Note that, if the JCS-based SFQ buffer circuit 100 is already in the second state, the arrival of additional input pulses at input terminal 102 does not toggle the state, i.e., the JCS-based SFQ buffer circuit 100 remains in the second state.

When the next clock pulse is received at clock terminal 104, JCS-based SFQ buffer circuit 100 outputs an output pulse at output terminal 106 only when SFQ buffer circuit 100 is in the second state. If SFQ buffer circuit 100 is in the second state (i.e., the set state), then the arrival of a clock pulse at clock terminal 104 annihilates the clockwise persistent current, which transitions SFQ buffer circuit 100 to the first state (i.e., the reset state). In this manner, JCS-based SFQ buffer circuit 100 can store information of whether or not an input pulse was received in the previous time period.

Figure 1B:
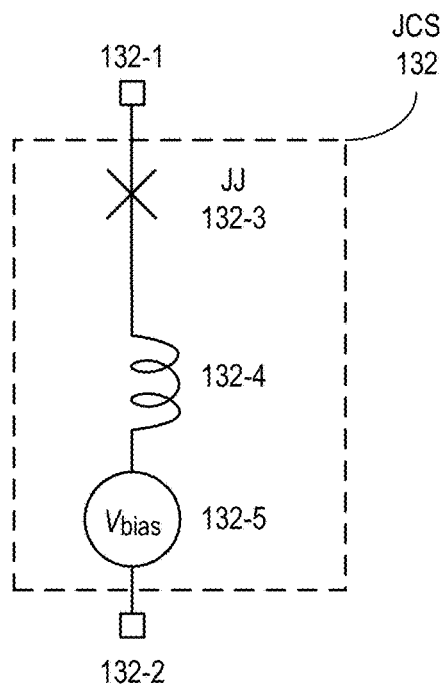
FIG. 1B illustrates a JCS in accordance with some embodiments described herein.

FIG. 1B illustrates a JCS in accordance with some embodiments described herein. JCS 132 can have two terminals, 132-1 and 132-2. As shown in FIG. 1A, terminal 132-1 can be electrically connected to superconducting inductors 110 and 112, and terminal 132-2 can be electrically connected to ground. JCS 132 includes bias voltage source 132-5, superconducting inductor 132-4, and JJ 132-3 that are electrically connected in series as shown in FIG. 1B.

Figure 1C:
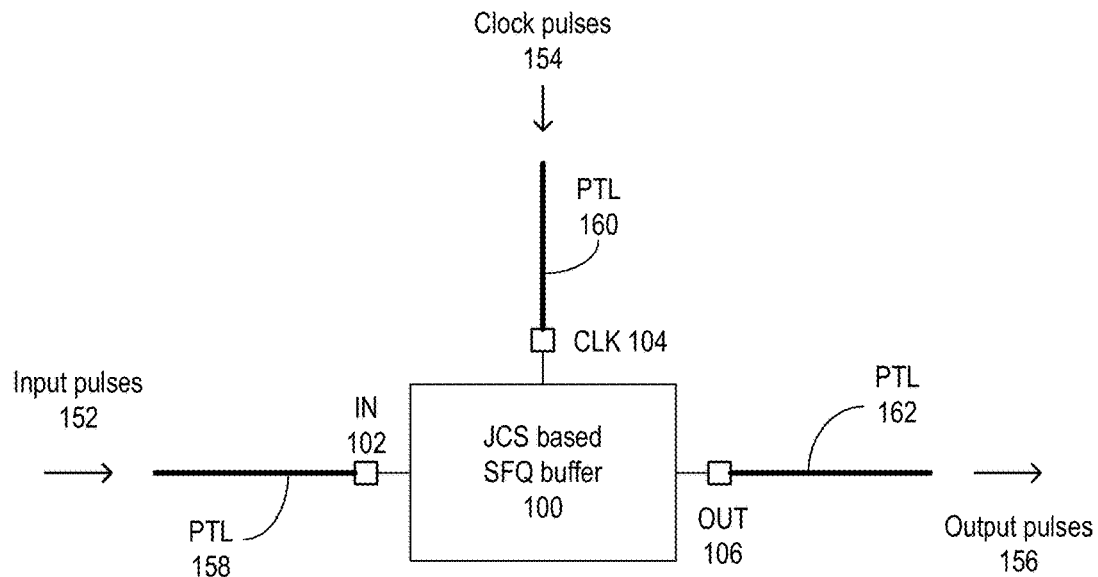
FIG. 1C illustrates a portion of a circuit design that includes a JCS-based SFQ buffer circuit in accordance with some embodiments described herein.

FIG. 1C illustrates a portion of a circuit design that includes a JCS-based SFQ buffer circuit in accordance with some embodiments described herein. One advantage of the JCS-based SFQ buffer circuit shown in FIG. 1A is that input terminal 102, clock terminal 104, and output terminal 106 can be directly coupled to PTLs (i.e., without using drivers and receivers at the two ends of the PTLs), which can substantially reduce the number of JJs that are used in the circuit design (which reduces the complexity and power consumption of the resulting circuit design). Moreover, as noted previously, the PTLs can have a higher impedance (narrower line width) without loss of transmission integrity. As shown in FIG. 1C, input terminal 102, clock terminal 104, and output terminal 106 are directly coupled to PTLs 158, 160, and 162, respectively. Input pulses 152 and clock pulses 154 can be directly received via PTLs 158 and 160, respectively, and output pulses 156 can be directly outputted on PTL 162.

Figure 2A:
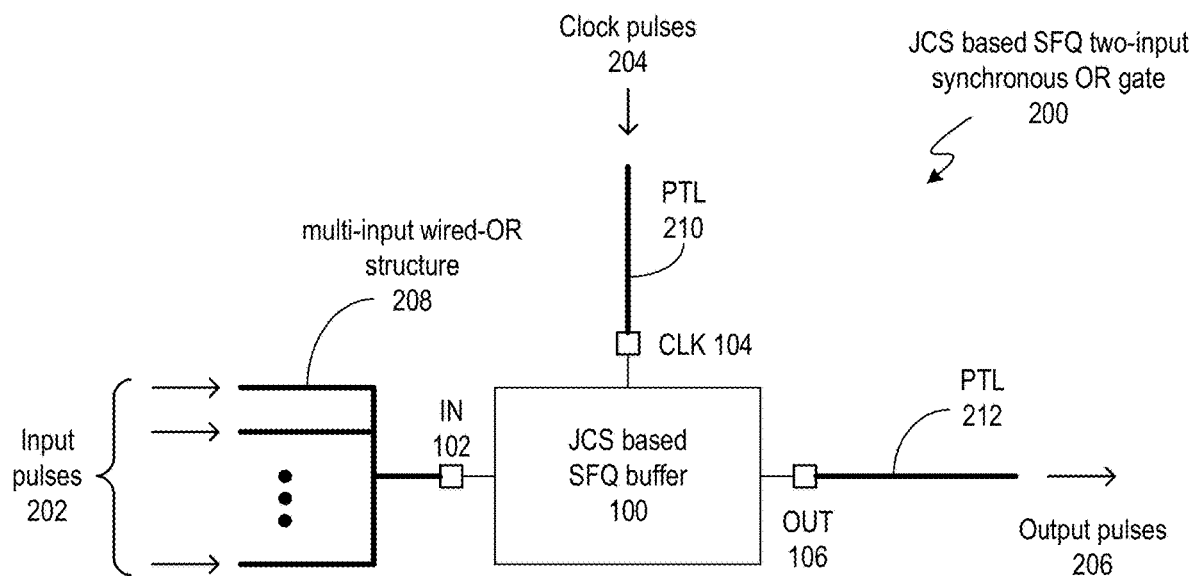
FIG. 2A illustrates a JCS-based SFQ multi-input synchronous OR gate in accordance with some embodiments described herein.

FIG. 2A illustrates a JCS-based SFQ multi-input synchronous OR gate in accordance with some embodiments described herein. Embodiments described in this disclosure feature library gates in which the output terminal includes a matching PTL termination resistance in series with the output JJ. For example, as shown in FIG. 1A, JCS-based SFQ buffer circuit 100 includes termination resistance 124.

The termination resistance can be electrically connected to one end of a PTL, and the other end of the PTL can be electrically connected to another library cell input. The length of the PTL can be between zero and a maximum value (due to signal loss over the PTL). The maximum allowable length of the PTL depends on various factors, including the manufacturing technology that is used to fabricate the IC.

In the SFQ technology described in this disclosure, the terminals of two SFQ circuits or cells can be directly connected, i.e., the output terminal (which includes the termination resistor) of the driver cell can be directly connected (i.e., by using a PTL of length zero) to the input terminal of the load cell. The capability to directly couple an output terminal of an SFQ cell with an input terminal of another SFQ cell is an important distinguishing feature of embodiments described herein. This capability is not present in traditional SFQ cells, which do not include a series resistances between outputs and inputs. Also, in the SFQ technology described in this disclosure, the series resistance eliminates current redistribution.

Furthermore, because the SFQ technology described in this disclosure uses resistances, currents can be split and added as in traditional IC designs, i.e., without any concern or need for handling quantization effects. Specifically, with resistances, wired-OR at inputs and resistive splitting at outputs is possible. The ability to add and split currents in SFQ-based circuit designs is an important advantage because it can substantially simplify logic implementation.

Stated differently, any circuit or cell that is designed using the SFQ technology described herein has the following property: every input can have a fan-in of two or more, meaning that every input can have a multi-input virtual OR gate driving the pin. Thus, a buffer can be used as a synchronous multi-input OR gate, and an inverter can be used as a synchronous multi-input NOR gate. The conversion of a buffer to a multi-input OR gate (and likewise the conversion of an inverter to a multi-input NOR gate) can be accomplished by allowing outputs of multiple cells to be electrically connected to the input pin of the buffer gate (or the inverter gate).

Referring to FIG. 2A, in JCS-based SFQ multi-input synchronous OR gate 200, multiple sequences of input pulses 202 can be combined using the multi-input wired-OR structure 208. As a non-limiting example, a set of horizontal strip lines can be electrically connected with each other using a vertical strip line to create the multi-input wired-OR structure 208, as shown in FIG. 2A. The combined input pulses 202 can then be inputted into JCS-based SFQ buffer 100 at input terminal 102. Clock pulses 204 can be received over PTL 210 and inputted into clock terminal 104. Finally, output terminal 106 can emit output pulses 206. Output pulses 206 represent a logical "OR" of input pulses 202, and the output pulses can be propagated over PTL 212 to one or more JCS-based SFQ cells.

Figure 2B:
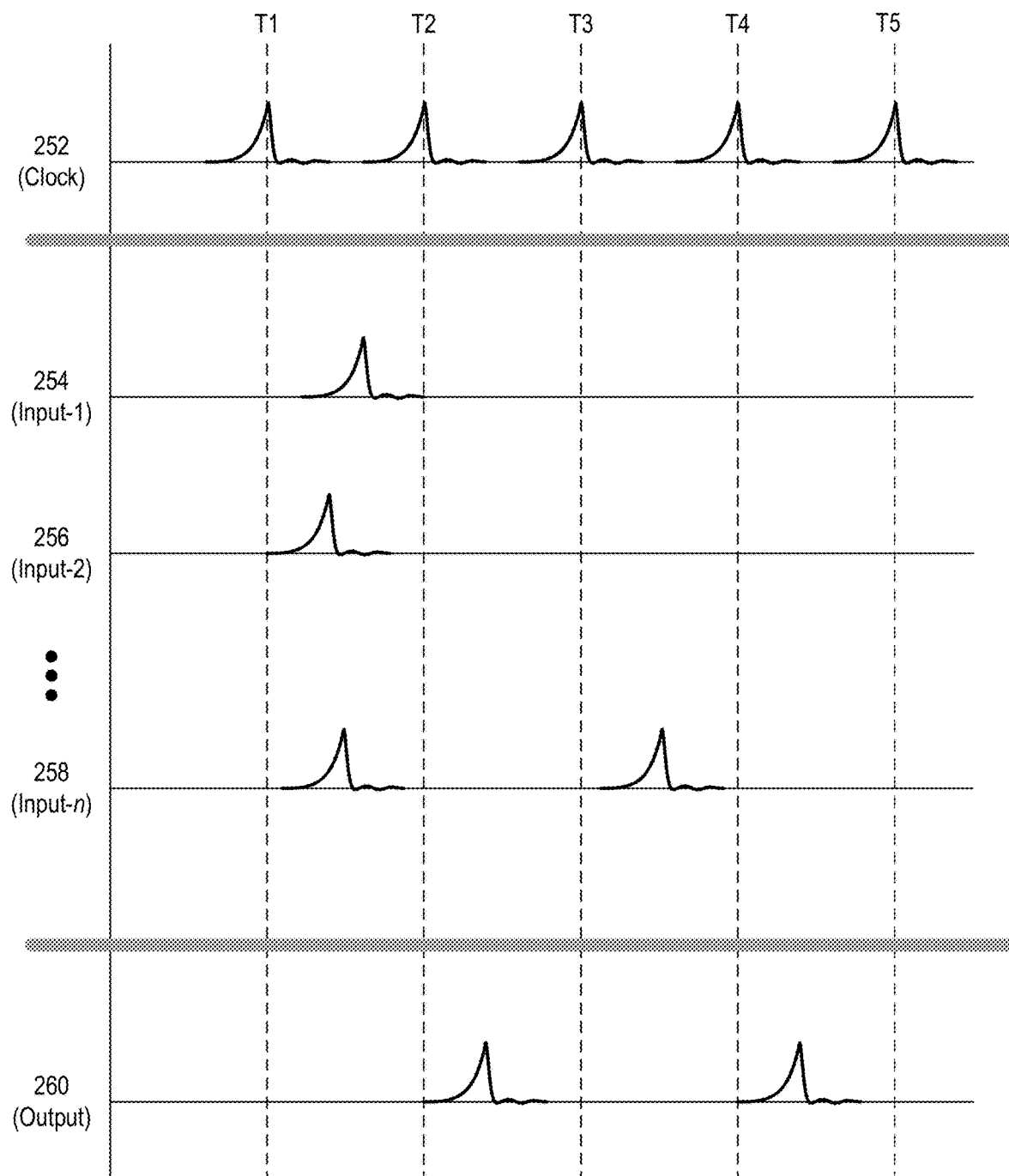
FIG. 2B illustrates a set of waveforms corresponding to a JCS-based SFQ multi-input synchronous OR gate in accordance with some embodiments described herein.

FIG. 2B illustrates a set of waveforms corresponding to a JCS-based SFQ multi-input synchronous OR gate in accordance with some embodiments described herein. Waveform 252 shows five clock pulses that are received at time instances T1 through T5. The time window between two adjacent clock pulses defines a time period (or time frame) during which input pulses can arrive on the multiple inputs of JCS-based SFQ multi-input synchronous OR gate 200. The input pulses do not need to be synchronized with each other, and they can arrive at any time instance within the time window defined by adjacent clock pulses as long as the input pulses do not violate setup and hold timing constraints.

For example, waveforms 254, 256, and 258 illustrate input pulses corresponding to three inputs of JCS-based SFQ multi-input synchronous OR gate 200. Note that three input pulses are received between time instances T1 and T2, and these input pulses are not synchronized with each other. These three input pulses can be combined by multi-input wired-OR structure 208 to produce at least one combined input pulse (which can have a different shape than the individual input pulses), and the combined input pulse can then be inputted into 102 of JCS-based SFQ multi-input synchronous OR gate 200, which can cause a persistent current circulating in JCS-based SFQ multi-input synchronous OR gate 200 to be established. Next, upon the arrival of the clock pulse at time instance T2, JCS-based SFQ multi-input synchronous OR gate 200 generates an output clock pulse which is shown in waveform 260. Note that there is a delay between the clock pulse that is received at time instance T2, and the output pulse produced by JCS-based SFQ multi-input synchronous OR gate 200 after time instance T2.

The clock pulse at time instance T2 resets JCS-based SFQ multi-input synchronous OR gate 200 to a reset state. Next, as shown in FIG. 2B, no input pulses are received between time instances T2 and T3, and JCS-based SFQ multi-input synchronous OR gate 200 remains in the reset state. Accordingly, when the clock pulse at time instance T3 arrives, JCS-based SFQ multi-input synchronous OR gate 200 does not produce a corresponding output pulse between time instances T3 and T4.

If we assume that the presence of a pulse encodes a binary "1," and the absence of a pulse encodes a binary "0," then the JCS-based SFQ multi-input synchronous OR gate 200 implements a multi-input OR gate. The implemented OR gate is "synchronous" because the output of the OR gate in the current time window is produced upon receiving a clock pulse, and the output (i.e., the presence or absence of a pulse) is based on the logical OR of the inputs received in the previous time window.

Figure 3A:
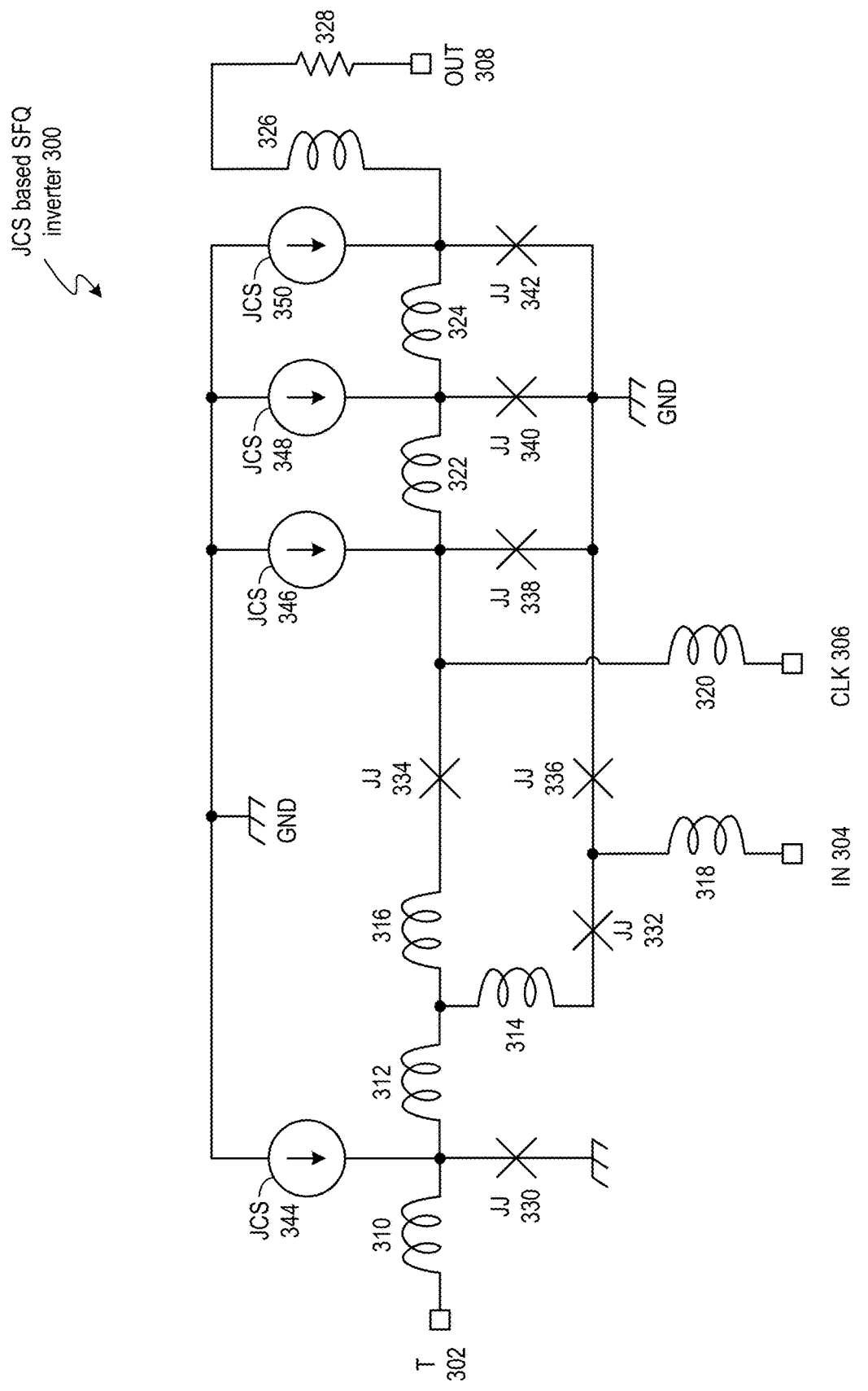
FIG. 3A illustrates a JCS-based SFQ inverter circuit in accordance with some embodiments described herein.

FIG. 3A illustrates a JCS-based SFQ inverter circuit in accordance with some embodiments described herein. JCS-based SFQ inverter circuit 300 includes: set terminal 302 (shown as "T" in FIG. 3A), input terminal 304, clock terminal 306, and output terminal 308; superconducting inductors 310, 312, 314, 316, 318, 320, 322, 324, and 326; termination resistance 328; JJs 330, 332, 334, 336, 338, 340, and 342; and JCSs 344, 346, 348, and 350.

The current supplied by JCSs 344, 346, 348, and 350 is used to bias the JJs 330, 332, 334, 336, 338, 340, and 342. Specifically, the bias currents of the JJs 330, 332, 334, 336, 338, 340, and 342 are set to a level that is less than their critical current $I_c$, and larger than $I_c$ minus the input pulse amplitude that is desired to trigger the JJs (e.g., the minimum input pulse amplitude that is desired to trigger the JJs). Note that, this range of current values (i.e., less than $I_c$, and greater than $I_c$ minus the input pulse amplitude that is desired to trigger the JJs) can be substantially smaller than the critical current $I_c$.

The circuit shown in FIG. 3A can be viewed as including: a first sub-circuit to store a reset state or a set state, where the first sub-circuit includes JJs 338, 340, and 342; a second sub-circuit to switch the first sub-circuit to the set state in response to receiving a pulse at set terminal 302, where the second sub-circuit includes JJ 330; and a third sub-circuit to switch the first sub-circuit to the reset state in response to receiving one or more pulses at input terminal 304, where the third sub-circuit includes JJs 332, 334, and 336.

During operation, input pulses can be received at input terminal 304 and clock pulses can be received at clock terminal 306. The clock pulses can also be provided to set terminal 302 (the clock pulses that are provided to clock terminal 306 may be a delayed version of the clock pulses that are provided to set terminal 302), which can set the JCS-based SFQ inverter circuit 300 at the beginning of each time period.

JCS-based SFQ inverter circuit 300 has two stable states that correspond to the absence or presence of a clockwise persistent current that circulates in the superconducting loop that includes junction 330, inductor 312, and the components connected through inductors 314 and 316. When a clock pulse is received at clock terminal 306, the state stored in JCS-based SFQ inverter circuit 300 is outputted on output terminal 308. Specifically, if the JCS-based SFQ inverter circuit 300 is in a first state (i.e., the reset state), the arrival of a clock pulse at clock terminal 306 does not cause JCS-based SFQ inverter circuit 300 to emit a corresponding output pulse at output terminal 308. On the other hand, if the JCS-based SFQ inverter circuit 300 is in a second state (i.e., the set state), the arrival of a clock pulse at clock terminal 306 causes JCS-based SFQ inverter circuit 300 to emit a corresponding output pulse at output terminal 308.

At the beginning of a time period, a clock pulse can be received at set terminal 302, which transitions JCS-based SFQ inverter circuit 300 to the second state. If no input pulse is received at input terminal 304 before the next clock pulse, then JCS-based SFQ inverter circuit 300 remains in the second state (i.e., the "set" state). On the other hand, if at least one input pulse is received at input terminal 304, then the persistent current that is circulating in the superconducting loop is annihilated, which causes the JCS-based SFQ inverter circuit 300 to switch to the first state (i.e., the "reset"

state). When the JCS-based SFQ inverter circuit 300 is in the first state (i.e., the "reset" state), receiving additional input pulses at the input terminal 304 does not cause JCS-based SFQ inverter circuit 300 to switch to the second state (i.e., the "set" state). In other words, if JCS-based SFQ inverter circuit 300 is in the first state, then JCS-based SFQ inverter circuit 300 continues to remain in the first state even if multiple input pulses are received at input terminal 304.

When the next clock pulse is received at clock terminal 306, JCS-based SFQ inverter circuit 300 outputs an output pulse at output terminal 308 only if it is in the second state. In this manner, JCS-based SFQ inverter circuit 300 implements inverter functionality by (1) emitting an output pulse at the output terminal 308 if no input pulse was received at the input terminal 304 in the previous time period, and (2) not emitting an output pulse at the output terminal 308 if at least one input pulse was received at the input terminal 304 in the previous time period.

Figure 3B:
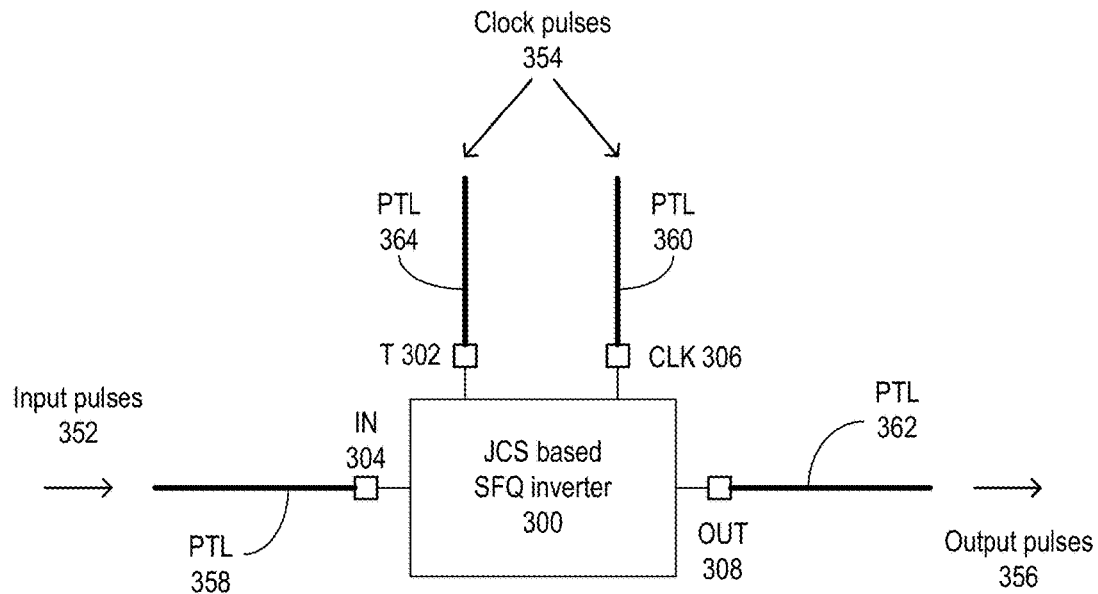
FIG. 3B illustrates a portion of a circuit design that includes a JCS-based SFQ inverter circuit in accordance with some embodiments described herein.

FIG. 3B illustrates a portion of a circuit design that includes a JCS-based SFQ inverter circuit in accordance with some embodiments described herein. An advantage of JCS-based SFQ inverter circuit 300 shown in FIG. 3A is that input terminal 304 and clock terminal 306 can be directly coupled to PTLs (i.e., without using drivers and receivers at the two ends of the PTLs), which can substantially reduce the number of JJs that are used in the circuit design (which reduces the complexity and power consumption of the resulting circuit design). Moreover, as noted previously, the PTLs can have a higher impedance (narrower line width) without loss of transmission integrity.

As shown in FIG. 3B, set terminal 302, input terminal 304, clock terminal 306, and output terminal 308 can be directly coupled to PTLs 364, 358, 360, and 362, respectively. Input pulses 352 can be directly received via PTL 358, and clock pulses 354 can be directly received via PTLs 360 and 364. Output pulses 356 can be directly outputted on PTL 362.

Figure 4A:
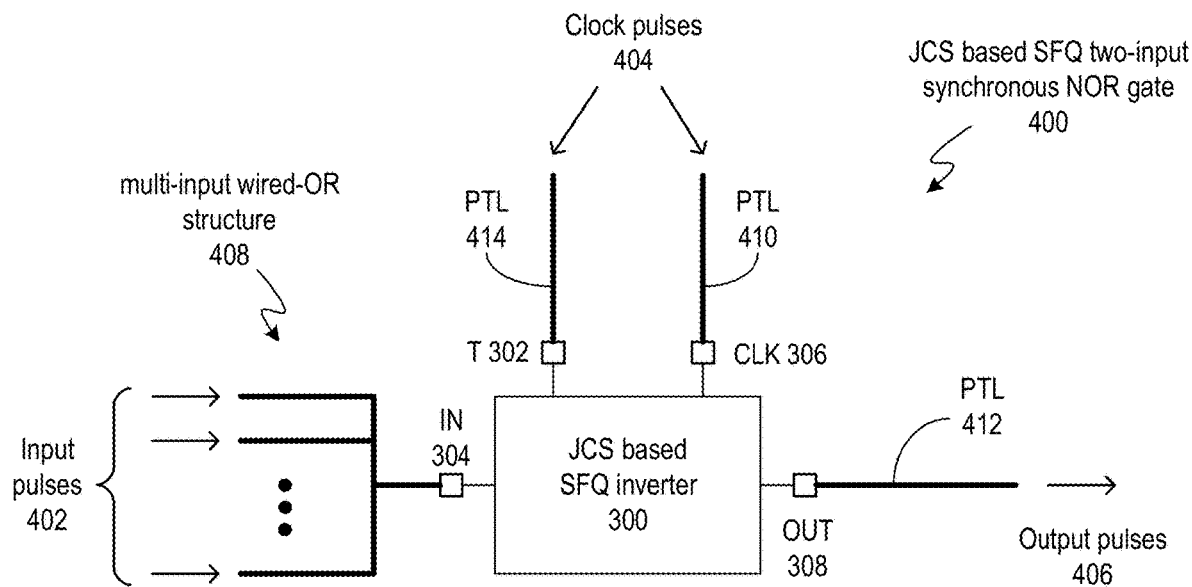
FIG. 4A illustrates a JCS-based SFQ multi-input synchronous NOR gate in accordance with some embodiments described herein.

FIG. 4A illustrates a JCS-based SFQ multi-input synchronous NOR gate in accordance with some embodiments described herein. Embodiments described in this disclosure feature library gates in which the output terminal includes a matching PTL termination resistance in series with the output JJ. For example, as shown in FIG. 3A, JCS-based SFQ inverter circuit 300 includes termination resistance 328. The termination resistance can be electrically connected to one end of a PTL, and the other end of the PTL can be electrically connected to another library cell input. The length of the PTL can be between zero and a maximum value (due to signal loss over the PTL). The maximum allowable length of the PTL depends on various factors, including the manufacturing technology that is used to fabricate the IC.

In JCS-based SFQ multi-input synchronous NOR gate 400, multiple sequences of input pulses 402 can be combined using the multi-input wired-OR structure 408. As a non-limiting example, a set of horizontal strip lines can be electrically connected with each other using a vertical strip line to create the multi-input wired-OR structure 408 shown in FIG. 4A. The combined input pulses 402 can then be inputted into JCS-based SFQ inverter 300 at input terminal 304. Clock pulses 404 can be received over PTL 410 and inputted into clock terminal 306, and can also be received over PTL 414 and inputted into set terminal 302. Finally, output terminal 308 can emit output pulses 406. Output pulses 406 can represent a logical "NOR" of input pulses 402, and the output pulses 406 can be propagated over PTL 412 to one or more JCS-based SFQ circuits or cells.

Figure 4B:
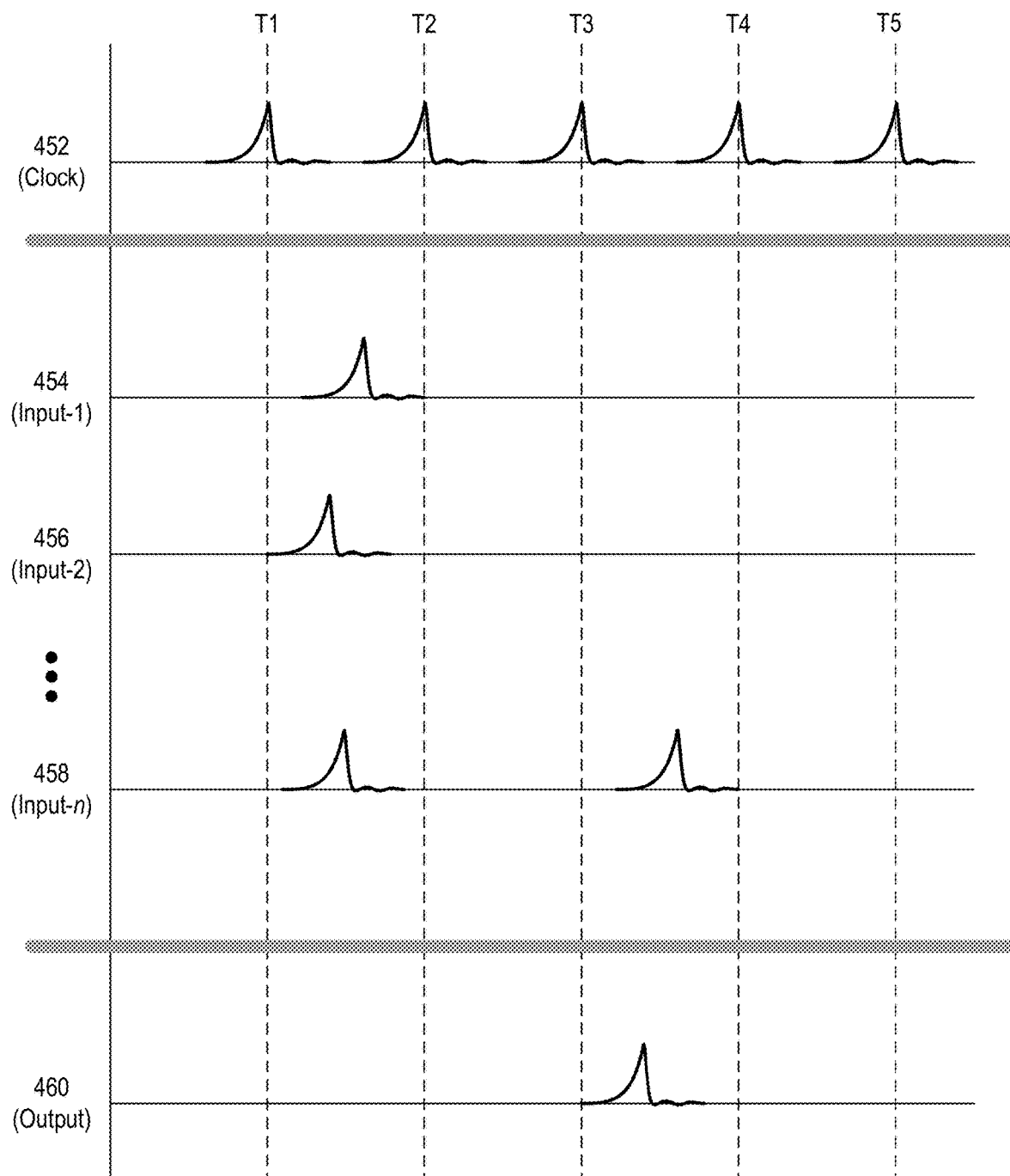
FIG. 4B illustrates a set of waveforms corresponding to a JCS-based SFQ multi-input synchronous NOR gate in accordance with some embodiments described herein.

FIG. 4B illustrates a set of waveforms corresponding to a JCS-based SFQ multi-input synchronous NOR gate in accordance with some embodiments described herein.

Waveform 452 shows five clock pulses that are received at time instances T1 through T5. The time window between two adjacent clock pulses defines a time period during which input pulses can arrive on the multiple inputs of JCS-based SFQ multi-input synchronous NOR gate 400. The input pulses do not need to be synchronized with each other, and they can arrive at any time instance within the time window defined by adjacent clock pulses as long as the input pulses do not violate setup and hold timing constraints.

For example, waveforms 454, 456, and 458 illustrate input pulses corresponding to three inputs of JCS-based SFQ multi-input synchronous NOR gate 400. When the clock pulse at time instance T1 is received at the set input 302, JCS-based SFQ inverter 300 is switched to the second state. As shown in FIG. 4B, three input pulses are received between time instances T1 and T2. Note that these input pulses need not be synchronized, as shown in FIG. 4B. These three input pulses can be combined by multi-input wired-OR structure 408 to produce at least one combined input pulse (which can have a different shape than the individual input pulses), and the combined input pulse can then be inputted into JCS-based SFQ inverter 300, which can cause the persistent current circulating in JCS-based SFQ inverter 300 to be annihilated. Next, as shown in waveform 460, upon the arrival of the clock pulse at time instance T2, JCS-based SFQ inverter 300 may not emit an output clock pulse.

The clock pulse at time instance T2 again sets JCS-based SFQ multi-input synchronous NOR gate 400 to a set state. Next, as shown in FIG. 4B, no input pulses are received between time instances T2 and T3, and JCS-based SFQ multi-input synchronous NOR gate 400 remains in the set state. Accordingly, when the clock pulse at time instance T3 arrives, JCS-based SFQ multi-input synchronous NOR gate 400 produces a corresponding output pulse between time instances T3 and T4. Note that there is a delay between the clock pulse that is received at time instance T3, and the output pulse produced by JCS-based SFQ multi-input synchronous OR gate 400 after time instance T3.

If we assume that the presence of a pulse encodes a binary "1," and the absence of a pulse encodes a binary "0," then JCS-based SFQ multi-input synchronous NOR gate 400 implements a multi-input NOR gate. The implemented NOR gate is "synchronous" because the output of the NOR gate in the current time window is produced when a clock pulse is received at the clock terminal, and the produced output (i.e., the presence or absence of a pulse) is based on the logical NOR of the inputs received in the previous time window.

Figure 5A:
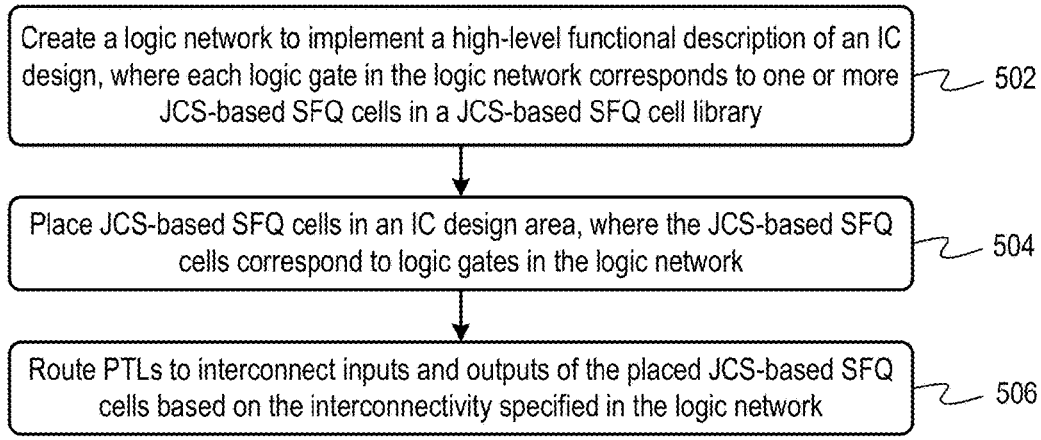
FIG. 5A illustrates a circuit design methodology for JCS-based SFQ circuits in accordance with some embodiments described herein.

FIG. 5A illustrates a circuit design methodology for JCS-based SFQ circuits in accordance with some embodiments described herein. The process illustrated in FIG. 5A can begin by creating a logic network to implement a high-level functional description of an IC design, where each logic gate in the logic network corresponds to one or more JCS-based SFQ cells in a JCS-based SFQ cell library (operation 502). Next, the process can place JCS-based SFQ cells in an IC design area, where the JCS-based SFQ cells correspond to logic gates in the logic network (operation 504). The process can then route PTLs to interconnect inputs and outputs of the placed JCS-based SFQ cells based on the interconnectivity specified in the logic network (operation 506). In some embodiments, the process illustrated in FIG. 5A can be performed by a processor.

Figure 5B:
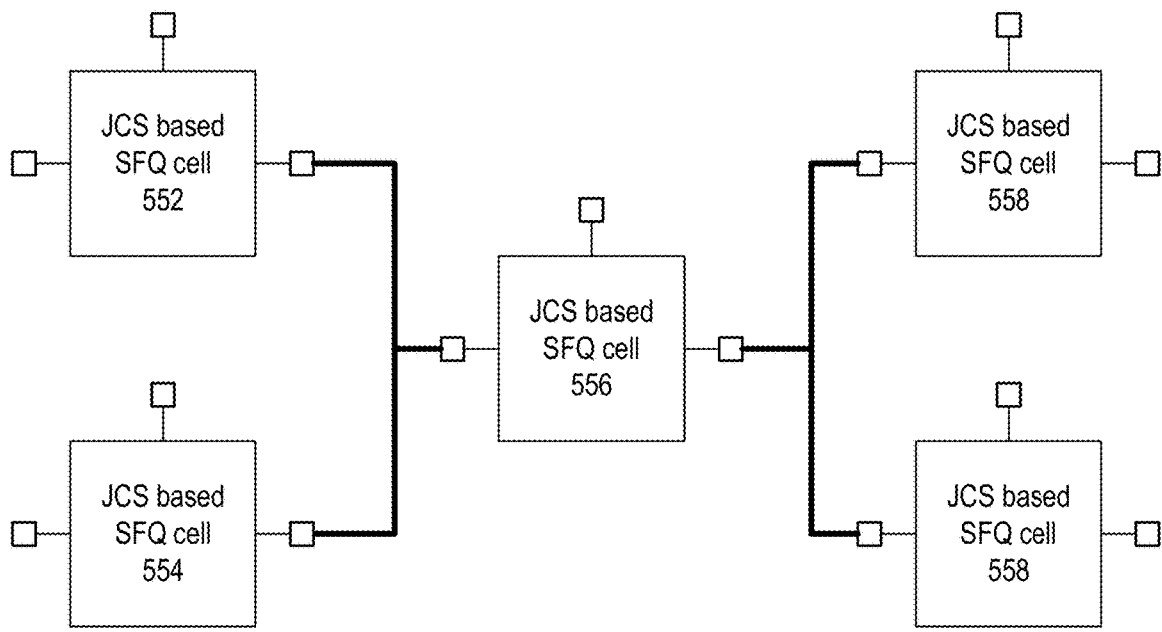
FIG. 5B illustrates a portion of a circuit design that may be created by using the process illustrated in FIG. 5A in accordance with some embodiments described herein.

FIG. 5B illustrates a portion of a circuit design that may be created by using the process illustrated in FIG. 5A in accordance with some embodiments described herein. Each cell is shown to have three terminals—the left terminal is the input terminal, the right terminal is the output terminal, and the top terminal is the clock terminal. Note that some cells (e.g., the JCS-based SFQ inverter circuit illustrated in FIG. 3A) may include more than three terminals. Also, the clock tree that feeds clock pulses to each cell has not been shown in FIG. 5B. In FIG. 5B, PTLs (shown as thick lines) have been used to route interconnections between the cells. Specifically, the PTL structure that feeds the input terminal of JCS-based SFQ cell 556 implements a wired-OR structure that performs a logical OR of the outputs of JCS-based SFQ cells 552 and 554. The output of JCS-based SFQ cell 556 is split and provided as input to JCS-based SFQ cells 558 and 560. Note that the PTL structure connected to the output of JCS-based SFQ cell 556 functions as a splitter.

In existing SFQ technology, the designer typically tweaks clock and data timing with JTLs, and cannot just connect logic gates and have a working logic network. Instead, the designer must carefully engineer the timing. The SFQ technology described in this disclosure overcomes this drawback in existing SFQ technology. Additionally, SFQ cells designed using the SFQ technology described in this disclosure can use gates that are cascadable with zero-skew clocking. Extra delay may need to be added to some gates, e.g., by using the JCS-based SFQ buffer circuit. In other words, the JCS-based SFQ buffer circuit can be used as a synchronous shift register.

The use of PTLs changes how timing references are defined. Currently, there is no standard for defining timing references. A set of timing definitions that can be used for cells designed using the SFQ technology are now described. Every logic cell can be synchronous, with a clock input, one or more data inputs, and a data output. A logic cell may also have other inputs, e.g., a set input as in the JCS-based SFQ inverter circuit that was described above. Upon receiving a clock pulse, the internal state of the logic cell can generate an output pulse or not generate an output pulse, and the logic cell can be returned back to a ready state. The term "ready state" refers to a state in which the cell is ready to receive and process new input data (i.e., input pulses).

While the cell is switching to its ready state, input data should not appear, as results would be undefined. In this disclosure, this time period is referred to as the "hold time." Once the cell has reached a stable ready state, the cell is ready to accept new input.

An input pulse can change the internal state of the cell to a different state. Whatever the internal state of the cell, it can be read with a clock pulse. The minimum time to establish the new internal state upon receiving an input pulse, i.e., the minimum time between an input pulse and the subsequent clock pulse, is referred to as the "setup time" in this disclosure.

A timing violation can occur if either of the "hold time" or the "setup time" constraints are violated. Specifically, a hold time violation occurs if an input pulse arrives before the cell has reached a stable ready state. A setup time violation occurs if a subsequent clock pulse (that causes the state of the cell to be outputted) arrives before the cell has been able to transition to a stable new state based on the received input data. The cell can produce undefined results when a timing violation occurs. When a clock pulse is received, the cell may produce an output pulse at the output terminal. The delay time between the clock pulse and the output pulse is referred to as the "latency" or "clock-to-Q-delay" of the cell.

Figure 6:
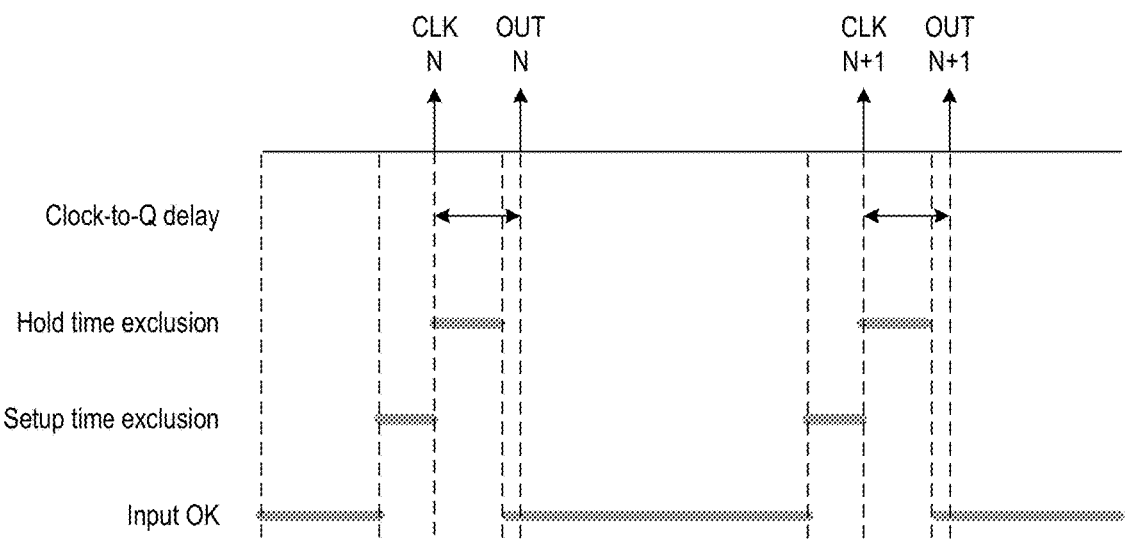
FIG. 6 illustrates three cell timing parameters in accordance with some embodiments described herein.

FIG. 6 illustrates three cell timing parameters in accordance with some embodiments described herein. The timing characteristics of cells designed using the SFQ technology described herein can be captured by using these three parameters, namely, hold time, setup time, and clock-to-Q-delay.

The following paragraphs describe approaches for designing an IC design, and supplying clock pulses to the SFQ cells in the IC design. In some embodiments, a classic pipeline design methodology can be used, where combinatorial logic networks appear between banks of D flip-flops (D-FFs). For example, JCS-based SFQ buffer circuit 100 shown in FIG. 1A can be used as a D-FF. A system clock can be provided, and a clock pulse can be applied to each D-FF synchronously. Logic networks can include timed gates (the terms "SFQ cell," "logic gate," "gate," etc. are used interchangeably in this disclosure), where no output appears until a timing pulse is given. The timing pulse can also be used to clear any internal state of the logic gate. The output represents the effect of pulses applied to the gate inputs since the last timing pulse. Within a logic network, data can flow from left to right. Data flow from right to left can be achieved by buffering data through the D-FF banks.

Assume for simplicity that all gates have the same delay from the timing pulse to the appearance of an output pulse. Each gate can be identified with a particular time slice or time period, which is a multiple of the sum of the delay and a setup time, based on the maximum time slice of inputs.

To ensure that each logic gate receives a timing pulse at the appropriate time instance, a sequencing circuit can be constructed whose outputs are timing pulses that are delivered to each logic gate, so that each gate receives the timing pulse at the correct time for the gate. The sequencing circuit can be constructed by using JTLs and splitters. Specifically, the sequencing circuit can take as input the system clock (as supplied to the D-FFs) and produce output pulses correctly timed for each gate.

The maximum number of slices used by a logic network in the system can determine the maximum system clock rate. At slower rates, the output of the SFQ cells may be ready well ahead of the next clock pulse. In the approach described herein, the system clock (which can include a sequence of clock pulses) can be applied to the D-FFs and clocking circuits, not individual gates, which can greatly simplify system clock distribution.

The construction of the sequencing circuit can be automated. The sequencing circuit can include a JTL which generates the time slice pulses, which are split by splitters according to the number of gates in the time slice. The splitters themselves can have delay, so that the input of the splitter tree may have to come from an earlier time slice than the actual time slice of the logic gate to which the clock pulse is to be provided. The clocking described herein is multi-phasing, which is different from higher-speed clocking. Each time slice receives one clock pulse per system clock. Furthermore, note that variations due to process and operating conditions in the time delay of JTL stages, splitters, and gates track corresponding variations to the critical current density.

Figure 7A:
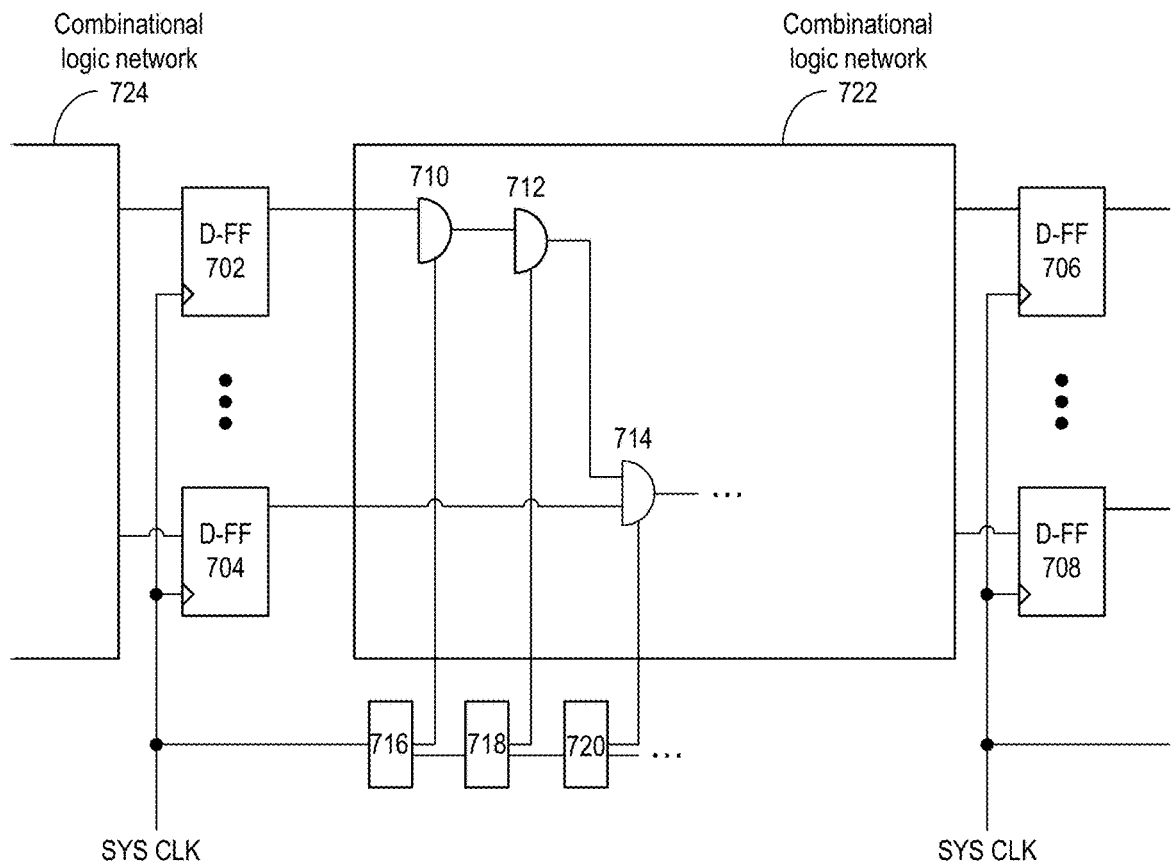
FIG. 7A illustrates an SFQ-based circuit design including a sequencing circuit to provide delayed clock pulses to cells in accordance with some embodiments described herein.

FIG. 7A illustrates an SFQ-based circuit design including a sequencing circuit to provide delayed clock pulses to cells in accordance with some embodiments described herein. In the portion of a circuit design shown in FIG. 7A, combinational logic networks 722 and 724 are coupled to banks of D-FFs that include D-FFs 702, 704, 706, and 708. Combinational logic network 722 can include logic gates 710, 712, and 714 which are interconnected as shown in FIG. 7A.

Each D-FF and logic gate shown in FIG. 7A can be implemented using the JCS-based SFQ technology disclosed herein. A sequencing circuit that includes delay elements 716, 718, and 720 can be used to provide a clock pulse with the appropriate delay to logic gates 710, 712, and 714, respectively. Each delay element (e.g., delay elements 716, 718, and 720) can include (1) a JTL that receives a clock pulse at its input and generates a delayed version of the clock pulse, and (2) a splitter network to generate at least two copies of the delayed version of the clock pulse, where one copy is provided to the input of the JTL in the next delay element, and other copies are provided to logic gates.

Figure 7B:
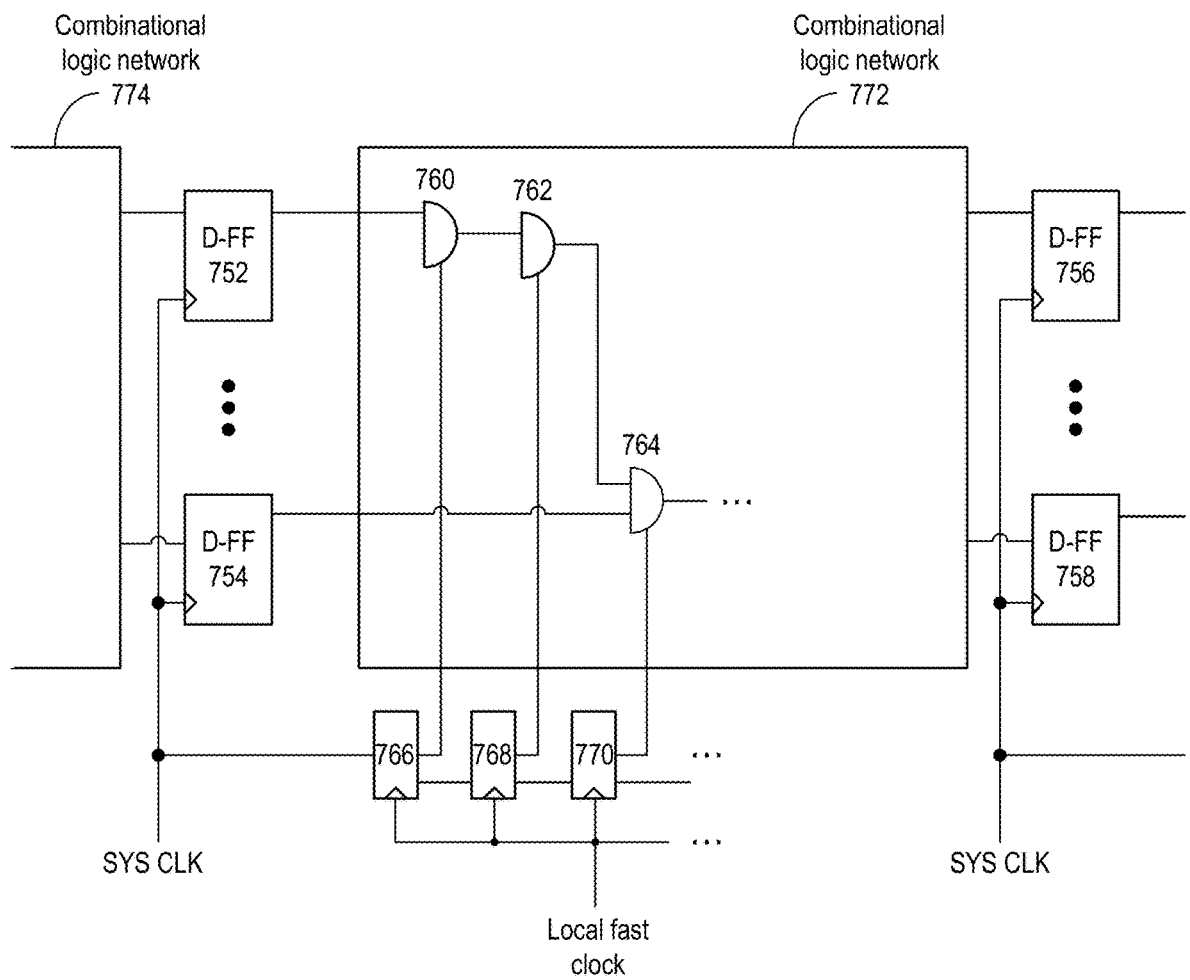
FIG. 7B illustrates an SFQ-based circuit design including a sequencing circuit to provide delayed clock pulses to cells in accordance with some embodiments described herein.

FIG. 7B illustrates an SFQ-based circuit design including a sequencing circuit to provide delayed clock pulses to cells in accordance with some embodiments described herein. The design shown in FIG. 7B is similar to the one shown in FIG. 7A, except that the sequencing circuit is constructed using a series of D-FFs that form a shift register, and that are timed using a local fast clock that can be generated internally on the chip. One advantage of the design shown in FIG. 7B is that it can provide variable delay to the logic gates. In the circuit design portion shown in FIG. 7B, combination logic networks 772 and 774 are coupled to banks of D-FFs that include D-FFs 752, 754, 756, and 758. Combinational logic network 772 can include logic gates 760, 762, and 764 which are interconnected as shown in FIG. 7B. Each D-FF and logic gate shown in FIG. 7B can be designed using the JCS-based SFQ technology disclosed herein. A sequencing circuit that includes delay elements 766, 768, and 770 can be used to provide a clock pulse with the appropriate delay to logic gates 760, 762, and 764, respectively. Each delay element (e.g., delay elements 766, 768, and 770) can include (1) a D-FF that receives a clock pulse at its input and generates a delayed version of the clock pulse, and (2) a splitter network to generate at least two copies of the delayed version of the clock pulse, where one copy is provided to the input of the D-FF in the next delay element, and other copies are provided to logic gates. The D-FFs in the delay elements can be provided a local fast clock signal that can be generated on chip.

Figure 7C:
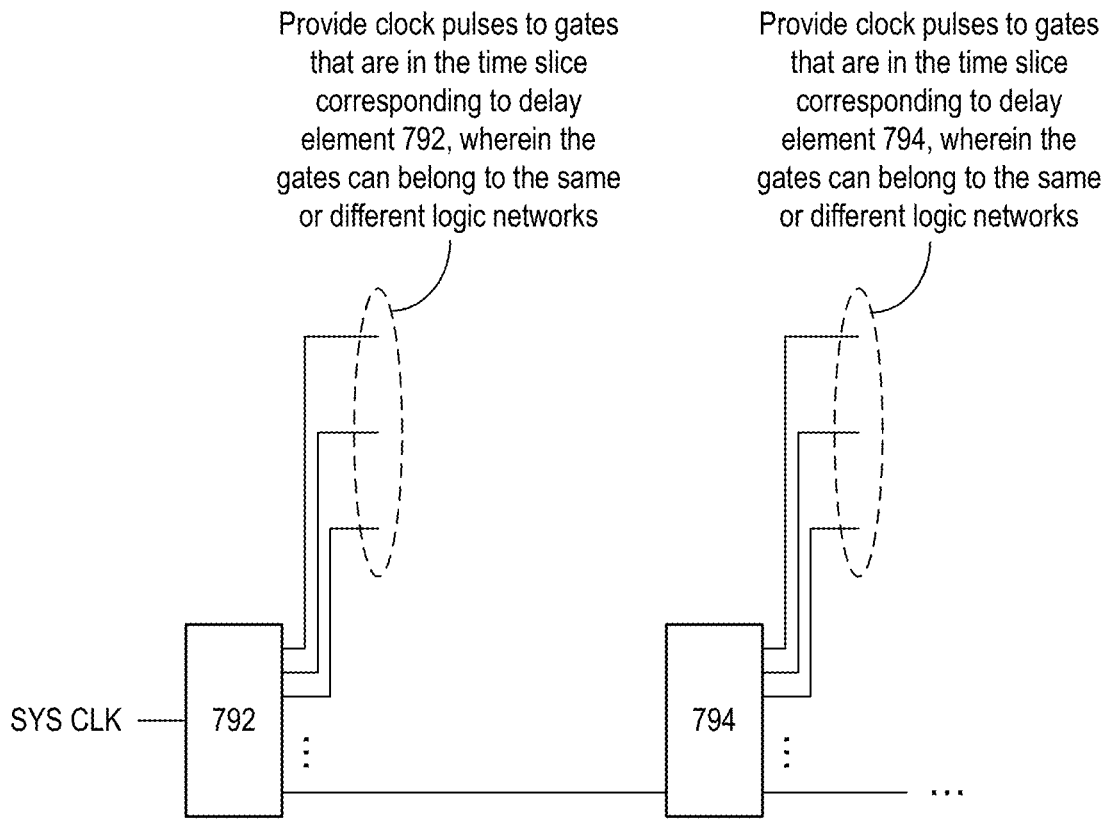
FIG. 7C illustrates a sequencing circuit to provide delayed clock pulses to cells in accordance with some embodiments described herein.

FIG. 7C illustrates a sequencing circuit to provide delayed clock pulses to cells in accordance with some embodiments described herein. Delay elements 792 and 794 can be constructed using either JTLs (as explained in reference to FIG. 7A) or D-FFs (as explained in reference to FIG. 7B). In FIG. 7C, each delay output can be split into multiple copies to drive similar clock frames from different pipeline stages. Consolidation of the sequencing circuitry in this manner can reduce the total device count used in the sequencing circuitry.

Figure 8:
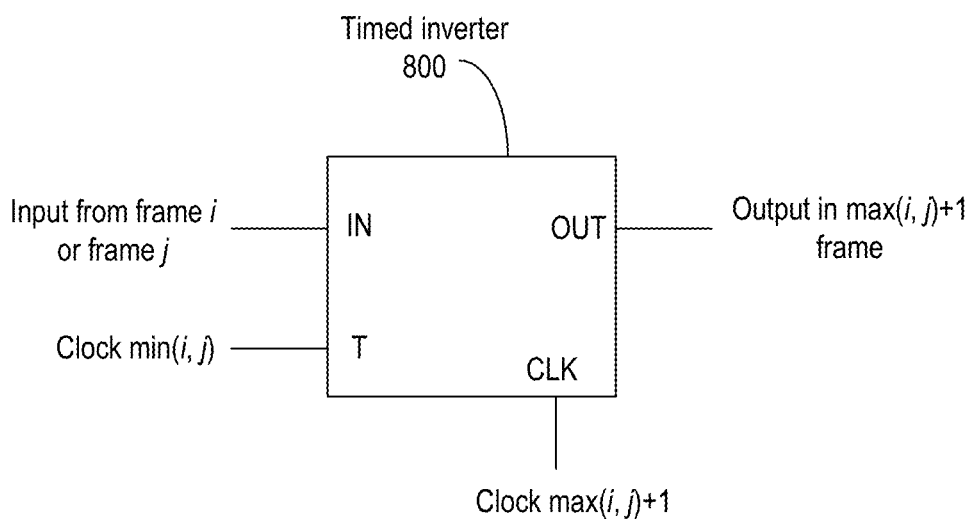
FIG. 8 illustrates how a timed inverter can be used in circuit designs in accordance with some embodiments described herein.

FIG. 8 illustrates how a timed inverter can be used in circuit designs in accordance with some embodiments described herein. Timed inverter 800 can be JCS-based SFQ inverter 300 shown in FIG. 3A. Let us assume that the timed inverter 800 is being used as a NOR gate (e.g., as explained in reference to FIGS. 4A-4B), and it receives two inputs from logic gates in clock frames i and j (the term "clock frame" refers to a particular delayed version of a clock pulse).

The "T" signal is split from the clock frame min(i, j), and is applied to the T input. The min(i, j) clock frame refers to the earlier clock frame between the two clock frames i and j. The CLK signal is given the clock pulse from max(i, j)+1 clock frame (this clock is also provided to other gates in general), and the output of the timed inverter 800 (which is also true of other gates in general) appears in this frame, i.e., in frame max(i, j)+1.

Figure 9:
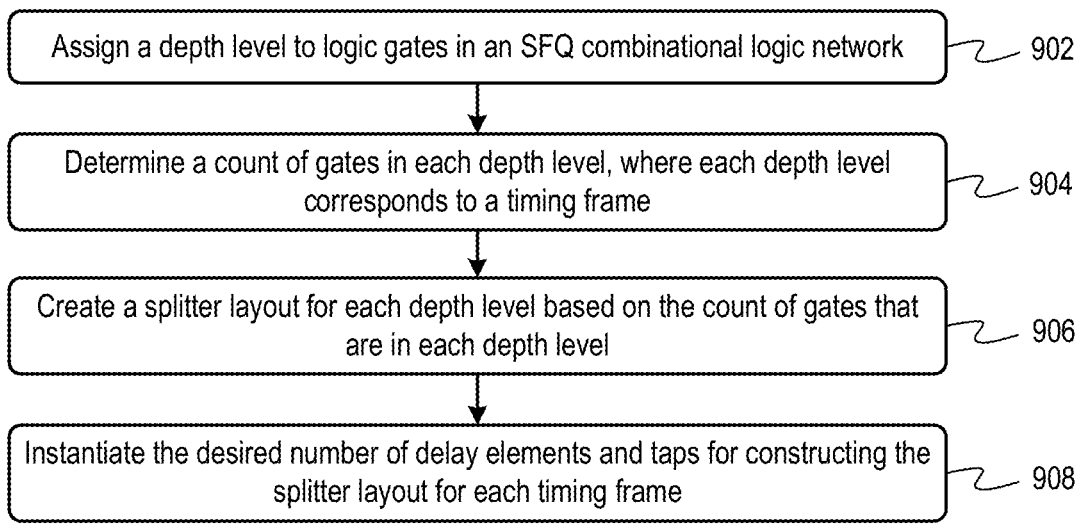
FIG. 9 illustrates a process for synthesizing a clock network for a SFQ-based circuit design in accordance with some embodiments described herein.

FIG. 9 illustrates a process for synthesizing a clock network for a SFQ-based circuit design in accordance with some embodiments described herein.

In some embodiments, the process illustrated in FIG. 9 can be performed by a processor. The process can begin by assigning a depth level to logic gates (e.g., logic gates 710, 712, and 714 in FIG. 7A) in an SFQ combinational logic network (operation 902). Specifically, the depth level of a logic gate is one more than the maximum input depth level across all of the inputs of the logic gate. If an input of a logic gate is coupled to an output of a D-FF that feeds the logic network, then that input is assigned a depth level zero. Otherwise, the depth level of an input is equal to the depth level of the logic gate that is driving the input. This process can be carried out recursively from the left to the right to assign a depth level to each logic gate in the combinational logic network. For example, when this process is used to assign levels to gates of combinational logic cloud 722, logic gate 710 can be assigned depth level 1, logic gate 712 can be assigned depth level 2, and logic gate 714 can be assigned depth level 3.

The process can then determine a count of gates in each depth level, where each depth level corresponds to a timing frame (operation 904).

Specifically, in some embodiments, the process can create a table such that each row in the table can correspond to a certain depth level, and a value stored in each row can represent the count of gates that are in that depth level. Note that the length of the table (i.e., the number of rows in the table) can be the depth of the logic network. The count of gates at a particular depth level can also represent the number of clock sinks in that timing frame.

Next, the process can create a splitter layout for each depth level based on the number of gates that are in each depth level (operation 906). The process can then instantiate the desired number of delay elements and taps for constructing the splitter layout for each timing frame (operation 908). Note that the process can use a small library of delay cells and splitter elements, which can be permuted to provide the timing pulses in the desired numbers and frames.

Figure 10:
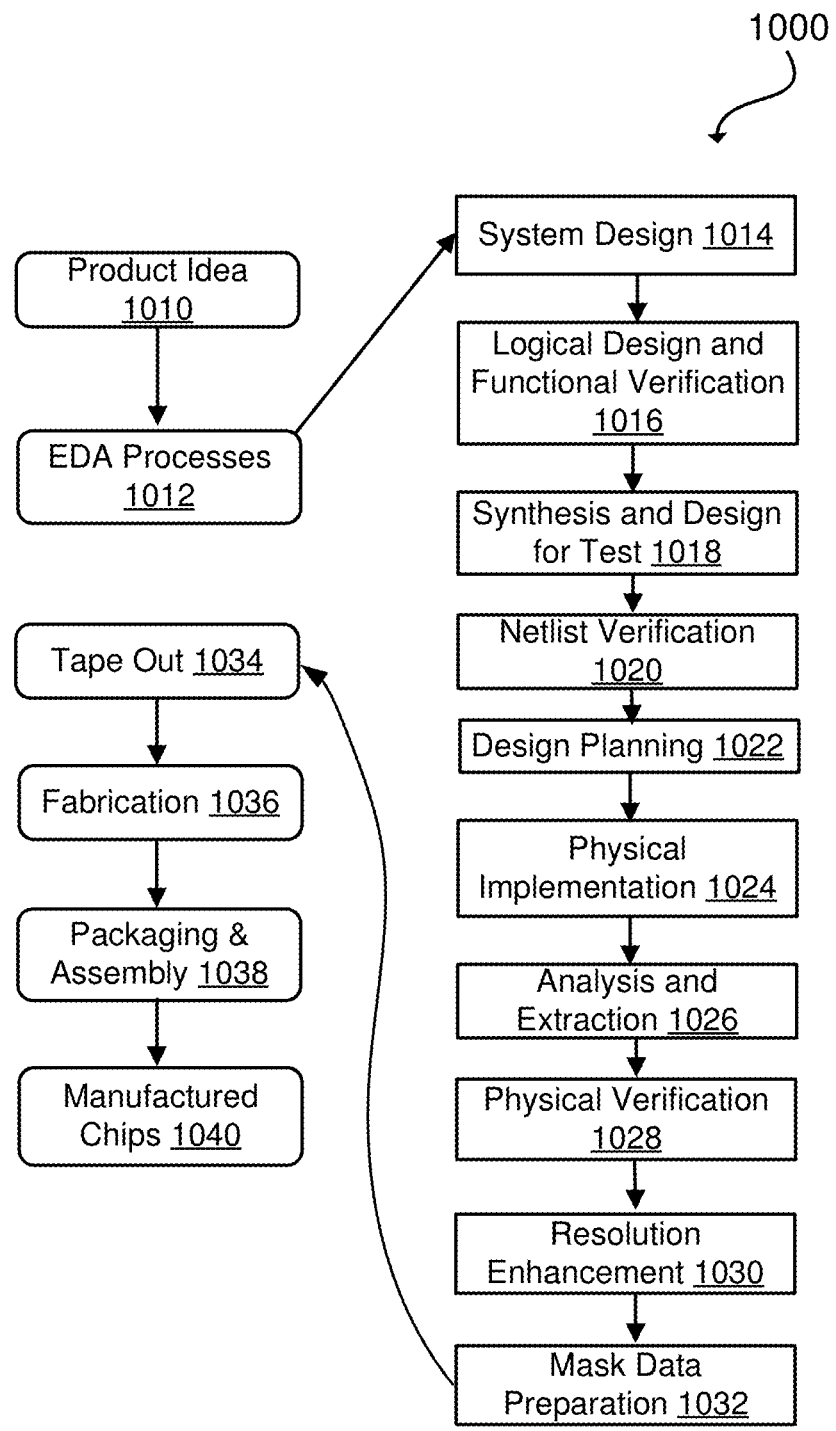
FIG. 10 depicts a flowchart that illustrates an IC design and manufacture flow in accordance with some embodiments described herein.

FIG. 10 illustrates an example flow 1000 for the design, verification, and fabrication of an integrated circuit in accordance with some embodiments described herein. EDA processes 1012 (as may have been mentioned above, the acronym "EDA" refers to "Electronic Design Automation") can be used to transform and verify design data and instructions that represent the integrated circuit. Each of these processes can be structured and enabled as multiple modules or operations.

Flow 1000 can start with the creation of a product idea 1010 with information supplied by a designer, information which is transformed and verified by using EDA processes 1012. When the design is finalized, the design is taped-out 1034, which is when artwork (e.g., geometric patterns) for the integrated circuit is sent to a fabrication facility to manufacture the mask set, which is then used to manufacture the integrated circuit. After tape-out, a semiconductor die is fabricated 1036 and packaging and assembly 1038 are performed to produce the manufactured IC chip 1040.

Specifications for a circuit or electronic structure may range from low-level transistor material layouts to high-level description languages. A high-level of abstraction may be used to design circuits and systems, using a hardware description language ("HDL") such as VHDL, Verilog, SystemVerilog, SystemC, MyHDL or OpenVera. The HDL description can be transformed to a logic-level register transfer level ("RTL") description, a gate-level description, a layout-level description, or a mask-level description. Each lower abstraction level that is a less abstract description adds more detail into the design description. The lower levels of abstraction that are less abstract descriptions can be generated by a computer, derived from a design library, or created by another design automation process. An example of a specification language at a lower level of abstraction language for specifying more detailed descriptions is SPICE (which stands for "Simulation Program with Integrated Circuit Emphasis"). Descriptions at each level of abstraction contain details that are sufficient for use by the corresponding tools of that layer (e.g., a formal verification tool).

During system design 1014, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 1016, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 1018, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 1020, the netlist is checked for compliance with timing constraints and for correspondence with the HDL code. During design planning 1022, an overall floor plan for the integrated circuit is constructed and analyzed for timing and top-level routing.

During layout or physical implementation 1024, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 1026, the circuit function is verified at the layout level, which permits refinement of the layout design.

During physical verification 1028, the layout design is checked to ensure that manufacturing constraints are correct, such as DRC constraints, electrical constraints, lithographic constraints, and that circuitry function matches the HDL design specification. During resolution enhancement 1030, the geometry of the layout is transformed to improve how the circuit design is manufactured.

During tape-out, data is created to be used (after lithographic enhancements are applied if appropriate) for production of lithography masks. During mask data preparation 1032, the 'tape-out' data is used to produce lithography masks that are used to produce finished integrated circuits.

A storage subsystem of a computer system (such as computer system 1100 of FIG. 11) may be used to store the programs and data structures that are used by some or all of the EDA products described herein, and products used for development of cells for the library and for physical and logical design that use the library.

Figure 11:
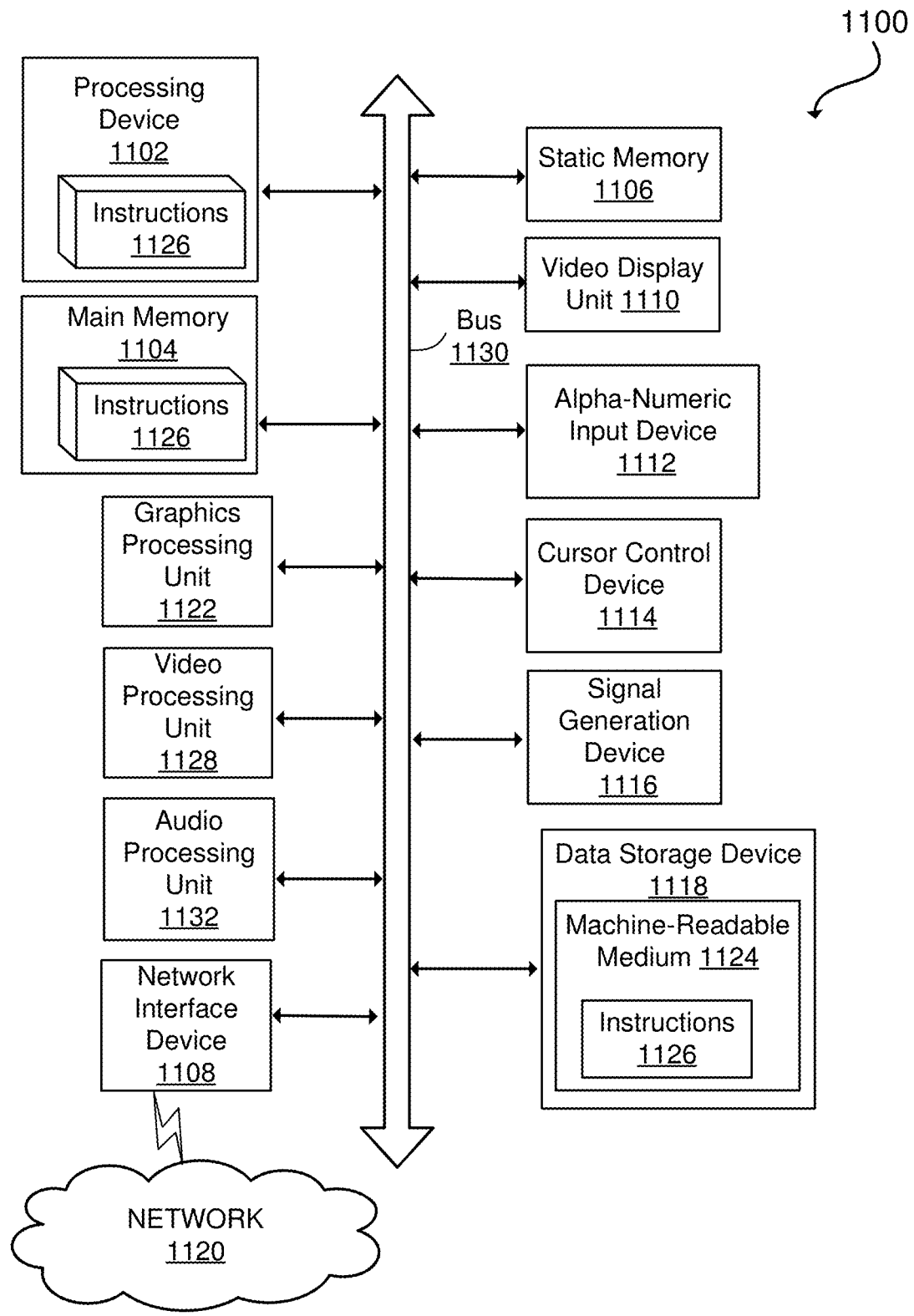
FIG. 11 illustrates an example machine of a computer system within which a set of instructions, for causing the machine to perform any one or more of the methodologies discussed herein, may be executed in accordance with some embodiments described herein.

FIG. 11 illustrates an example machine of a computer system 1100 within which a set of instructions, for causing the machine to perform any one or more of the methodologies discussed herein, may be executed.

In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1100 includes a processing device 1102, a main memory 1104 (e.g., read-only memory (ROM), flash memory, dynamic random access memory (DRAM) such as synchronous DRAM (SDRAM), a static memory 1106 (e.g., flash memory, static random access memory (SRAM), etc.), and a data storage device 1118, which communicate with each other via a bus 1130.

Processing device 1102 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1102 may also be one or more special-purpose processing devices such as an application specific integrated circuit (ASIC), a field programmable gate array (FPGA), a digital signal processor (DSP), network processor, or the like. The processing device 1102 may be configured to execute instructions 1126 for performing the operations and steps described herein.

The computer system 1100 may further include a network interface device 1108 to communicate over the network 1120. The computer system 1100 also may include a video display unit 1110 (e.g., a liquid crystal display (LCD) or a cathode ray tube (CRT)), an alphanumeric input device 1112 (e.g., a keyboard), a cursor control device 1114 (e.g., a mouse), a graphics processing unit 1122, a signal generation device 1116 (e.g., a speaker), graphics processing unit 1122, video processing unit 1128, and audio processing unit 1132.

The data storage device 1118 may include a machine-readable storage medium 1124 (also known as a non-transitory computer-readable medium) on which is stored one or more sets of instructions 1126 or software embodying any one or more of the methodologies or functions described herein. The instructions 1126 may also reside, completely or at least partially, within the main memory 1104 and/or within the processing device 1102 during execution thereof by the computer system 1100, the main memory 1104 and the processing device 1102 also constituting machine-readable storage media.

In some implementations, the instructions 1126 include instructions to implement functionality corresponding to the present disclosure. While the machine-readable storage medium 1124 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1102 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A circuit, comprising:
   a single flux quantum (SFQ) combinational logic network comprising a set of SFQ logic cells;
   an SFQ sequencing circuit to generate delayed versions of clock pulses to clock the set of SFQ logic cells; and
   a set of SFQ flip-flop cells, wherein an output of at least on SFQ flip-flop cell in the set of SFQ flip-flop cells is coupled to an input of at least one SFQ logic cell in the set of SFQ logic cells.

2. The circuit of claim 1, wherein each SFQ flip-flop cell in the set of SFQ flip-flop cells is assigned a level value of zero, and wherein each SFQ logic cell in the set of SFQ logic cells is assigned a level value that is one greater than a maximum level value of SFQ flip-flop cells or SFQ logic cells that are coupled to inputs of the SFQ logic cell.

3. The circuit of claim 2, wherein the SFQ sequencing circuit comprises a series of SFQ delay sub-circuits, wherein each SFQ delay sub-circuit corresponds to a specific level value.

4. The circuit of claim 3, wherein each SFQ delay sub-circuit comprises a Josephson transmission line (JTL) and a splitter sub-circuit comprising one or more splitters.

5. The circuit of claim 3, wherein each SFQ delay sub-circuit comprises a SFQ flip-flop and a splitter sub-circuit comprising one or more splitters.

6. The circuit of claim 3, wherein at least one SFQ delay sub-circuit clocks SFQ logic cells in multiple SFQ combinational logic networks.

7. The circuit of claim 1, wherein at least one SFQ logic cell in the set of SFQ logic cells comprises at least one Josephson junction biased using a Josephson junction based current source.

8. The circuit of claim 1, wherein at least one SFQ logic cell in the set of SFQ logic cells comprises a Josephson junction, wherein an output terminal of the SFQ logic cell is coupled to a terminal of the Josephson junction through a termination resistance and a superconducting inductor.

9. A circuit, comprising:
a set of single flux quantum (SFQ) flip-flop cells;
a set of SFQ combinational logic networks, each SFQ combinational logic network comprising a set of SFQ logic cells;
wherein an output of at least one SFQ flip-flop cell is coupled to an input of at least one SFQ logic cell; and
wherein delayed versions of clock pulses are provided to SFQ logic cells in the set of SFQ combinational logic networks.

10. The circuit of claim 9, wherein each SFQ flip-flop cell is assigned a level value of zero, and wherein each SFQ logic cell is assigned a level value that is one greater than a maximum level value of SFQ flip-flop cells or SFQ logic cells that are coupled to inputs of the SFQ logic cell.

11. The circuit of claim 10, comprising an SFQ sequencing circuit to generate the delayed versions of the clock pulses.

12. The circuit of claim 11, wherein the SFQ sequencing circuit comprises a series of SFQ delay sub-circuits, wherein each SFQ delay sub-circuit corresponds to a specific level value.

13. The circuit of claim 12, wherein each SFQ delay sub-circuit comprises a Josephson transmission line (JTL) and a splitter sub-circuit comprising one or more splitters.

14. The circuit of claim 12, wherein each SFQ delay sub-circuit comprises a SFQ flip-flop and a splitter sub-circuit comprising one or more splitters.

15. The circuit of claim 9, wherein at least one SFQ logic cell comprises at least one Josephson junction biased using a Josephson junction based current source.

16. The circuit of claim 9, wherein at least one SFQ logic cell comprises a Josephson junction, wherein an output terminal of the SFQ logic cell is coupled to a terminal of the Josephson junction through a termination resistance and a superconducting inductor.

17. A circuit, comprising:
a single flux quantum (SFQ) combinational logic network comprising SFQ logic cells coupled using superconducting stripline structures; and
an SFQ sequencing circuit to generate delayed versions of clock pulses to clock the SFQ logic cells.

18. The circuit of claim 17, wherein at least one SFQ logic cell comprises at least one Josephson junction biased using a Josephson junction based current source, wherein the Josephson junction based current source comprises a Josephson junction.

19. The circuit of claim 17, wherein at least one SFQ logic cell comprises a Josephson junction, wherein an output terminal of the SFQ logic cell is coupled to a terminal of the Josephson junction through a termination resistance and a superconducting inductor.

* * * * *

UNITED STATES PATENT AND TRADEMARK OFFICE
CERTIFICATE OF CORRECTION

PATENT NO. : 11,233,516 B1
APPLICATION NO. : 16/926379
DATED : January 25, 2022
INVENTOR(S) : Stephen Robert Whiteley et al.

Page 1 of 1

It is certified that error appears in the above-identified patent and that said Letters Patent is hereby corrected as shown below:

In the Claims

Claim 1 Column 18, Line 49, delete the word, "on" and replace with the word --one--.

Signed and Sealed this
Fifteenth Day of March, 2022

Drew Hirshfeld
*Performing the Functions and Duties of the*
*Under Secretary of Commerce for Intellectual Property and*
*Director of the United States Patent and Trademark Office*